United States Patent
Ninomiya et al.

(10) Patent No.: US 9,905,397 B2
(45) Date of Patent: Feb. 27, 2018

(54) ION IMPLANTATION APPARATUS AND SCANNING WAVEFORM PREPARATION METHOD

(71) Applicant: SUMITOMO HEAVY INDUSTRIES ION TECHNOLOGY CO., LTD., Tokyo (JP)

(72) Inventors: Shiro Ninomiya, Ehime (JP); Akihiro Ochi, Ehime (JP)

(73) Assignee: SUMITOMO HEAVY INDUSTRIES ION TECHNOLOGY CO., LTD., Tokyo (JP)

( * ) Notice: Subject to any disclaimer, the term of this patent is extended or adjusted under 35 U.S.C. 154(b) by 0 days.

(21) Appl. No.: 15/457,698

(22) Filed: Mar. 13, 2017

(65) Prior Publication Data

US 2017/0271128 A1 Sep. 21, 2017

(30) Foreign Application Priority Data

Mar. 18, 2016 (JP) .................................. 2016-055824

(51) Int. Cl.
| | |
|---|---|
| H01J 37/00 | (2006.01) |
| H01J 37/317 | (2006.01) |
| H01J 37/08 | (2006.01) |
| H01J 37/147 | (2006.01) |
| H01J 37/244 | (2006.01) |

(52) U.S. Cl.
CPC .......... *H01J 37/3171* (2013.01); *H01J 37/08* (2013.01); *H01J 37/1474* (2013.01); *H01J 37/244* (2013.01)

(58) Field of Classification Search
CPC ...... H01J 37/3171; H01J 37/244; H01J 37/08; H01J 37/1474
USPC ............................................ 250/492.1–492.3
See application file for complete search history.

(56) References Cited

U.S. PATENT DOCUMENTS

| | | |
|---|---|---|
| 8,368,036 B2 | 2/2013 | Hino |
| 8,735,181 B2 | 5/2014 | Fujii et al. |
| 8,772,741 B2 | 7/2014 | Ninomiya et al. |
| 9,165,772 B2 | 10/2015 | Ninomiya et al. |
| 2006/0145096 A1* | 7/2006 | Benveniste ......... H01J 37/3171 250/492.21 |

(Continued)

FOREIGN PATENT DOCUMENTS

| | | |
|---|---|---|
| JP | 2009-099857 A | 5/2009 |
| JP | 5311112 B2 | 10/2013 |

(Continued)

*Primary Examiner* — Michael Maskell
(74) *Attorney, Agent, or Firm* — Michael Best & Friedrich LLP

(57) ABSTRACT

An ion implantation apparatus includes a beam scanner that provides reciprocating beam scanning in a beam scanning direction, a beam measurer that measures a beam current intensity distribution in the beam scanning direction at a downstream of the beam scanner, and a controller. The controller includes a scanning waveform preparing unit that determines whether or not a measured beam current intensity distribution measured by the beam measurer with use of a given scanning waveform fits a target non-uniform dose amount distribution, and that, in a case of fitting, correlates the given scanning waveform with the target non-uniform dose amount distribution.

20 Claims, 10 Drawing Sheets

(56) References Cited

U.S. PATENT DOCUMENTS

2015/0311077 A1* 10/2015 Kurose .............. H01J 37/3002
438/5

FOREIGN PATENT DOCUMENTS

JP         5575025 B2    8/2014
JP         5638995 B2    12/2014

* cited by examiner

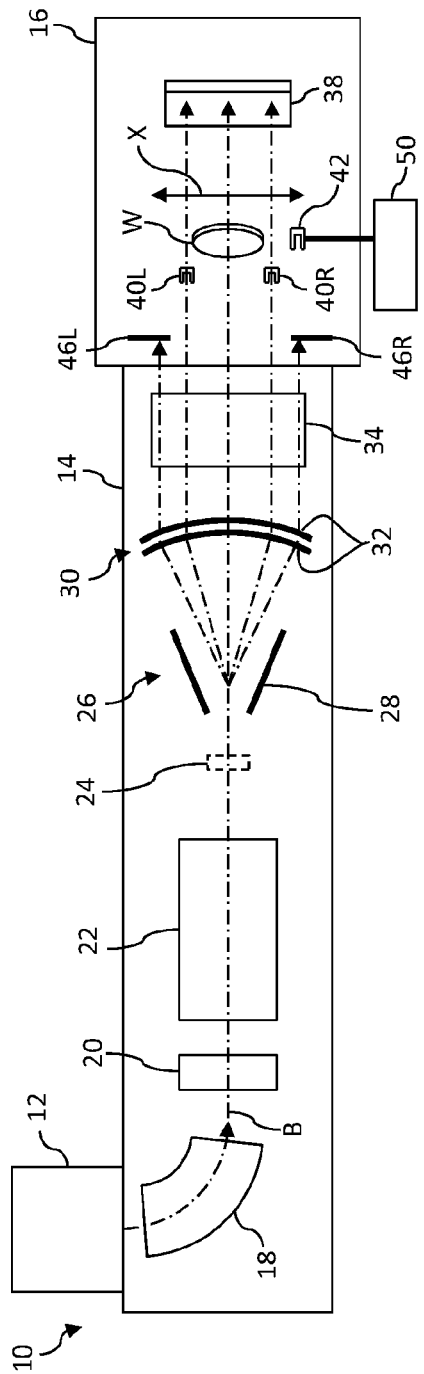
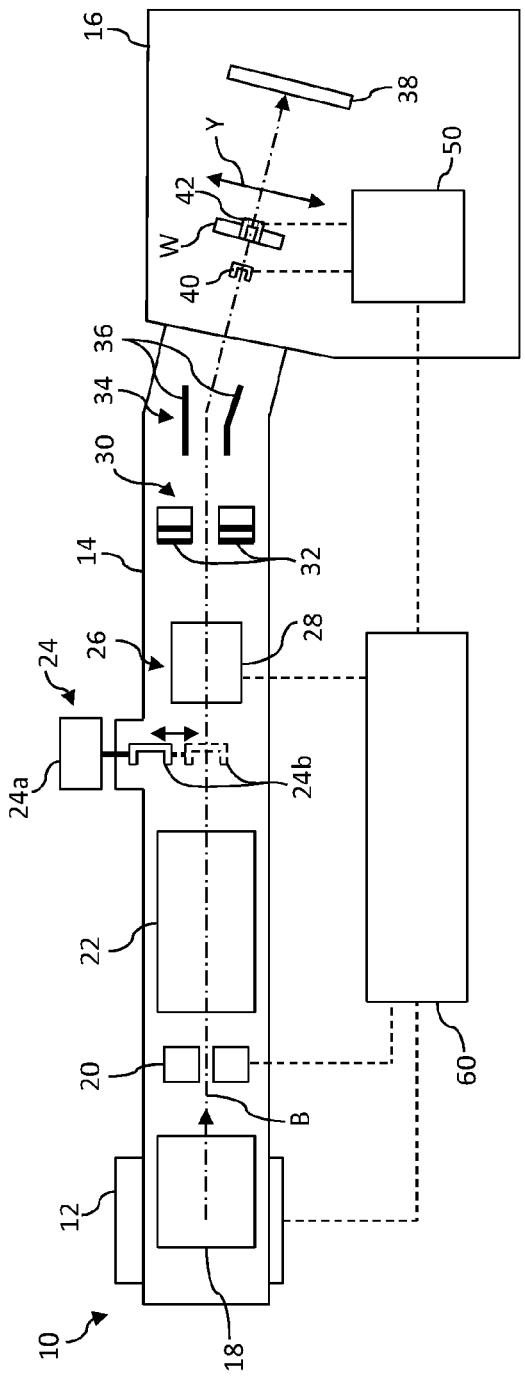
FIG. 1A
FIG. 1B

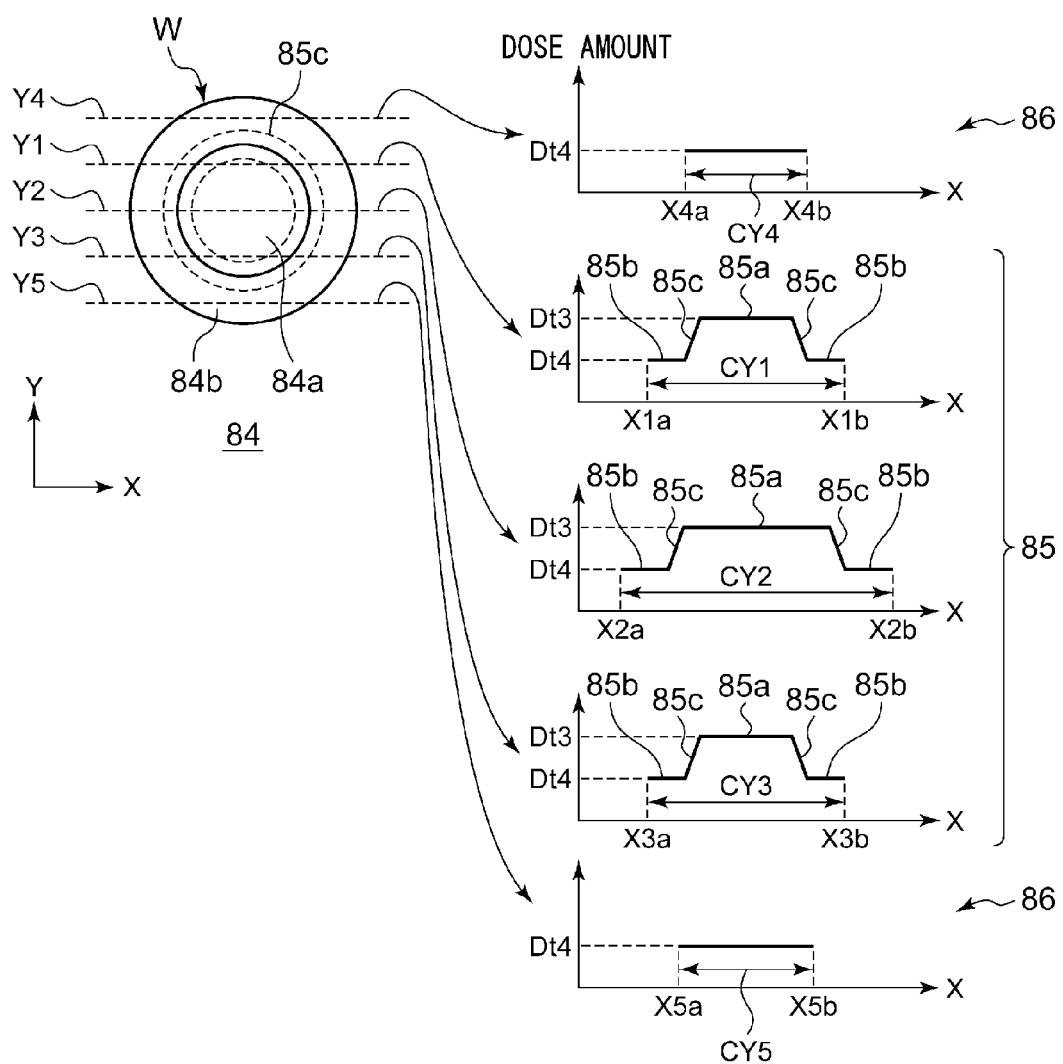

ION IMPLANTATION APPARATUS AND SCANNING WAVEFORM PREPARATION METHOD

RELATED APPLICATION

Priority is claimed to Japanese Patent Application No. 2016-55824, filed on Mar. 18, 2016, the entire content of which is incorporated herein by reference.

BACKGROUND OF THE INVENTION

1. Field of the Invention

The present invention relates to an ion implantation apparatus and a scanning waveform preparation method.

2. Description of the Related Art

In a semiconductor production process, a step of implanting ions to a semiconductor wafer is generally performed for the purpose of changing the conductivity and/or the crystalline structure of the semiconductor wafer. An apparatus that is used in this step is generally called an ion implantation apparatus. In many cases, a uniform two-dimensional ion implantation amount distribution in the wafer plane is required to be achieved. However, there is a case in which a non-uniform two-dimensional ion implantation amount distribution is intentionally required.

SUMMARY OF THE INVENTION

An illustrative object of an aspect of the invention is to provide a technique of accurately achieving a non-uniform two-dimensional ion implantation amount distribution on a surface of a substrate.

According to an aspect of the invention, an ion implantation apparatus includes a beam scanner that provides reciprocating beam scanning in a beam scanning direction in accordance with a scanning waveform, a mechanical scanner that reciprocates a substrate in a mechanical scanning direction, a controller that controls the beam scanner and the mechanical scanner such that a target two-dimensional non-uniform dose amount distribution is provided on a surface of the substrate, and a beam current measurer that measures a beam current intensity distribution in the beam scanning direction at a downstream of the beam scanner. The controller includes a target setting unit that converts the target two-dimensional non-uniform dose amount distribution into a plurality of target dose amount distributions each of which is a dose amount distribution in the beam scanning direction and which are formed in different positions from each other in the mechanical scanning direction, and a beam scanner driving unit that obtains scanning waveforms corresponding to the plurality of target dose amount distributions from an implantation scanning waveform database, selects one of the obtained scanning waveforms in accordance with a position of the substrate in the mechanical scanning direction, and drives the beam scanner with use of the selected scanning waveform. The plurality of target dose amount distributions include at least one target non-uniform dose amount distribution. The controller further includes a scanning waveform preparing unit that determines whether or not a measured beam current intensity distribution measured by the beam current measurer with use of a given scanning waveform fits the target non-uniform dose amount distribution, and that, in a case of fitting, correlates the given scanning waveform with the target non-uniform dose amount distribution and stores the scanning waveform into the implantation scanning waveform database.

According to an aspect of the invention, an ion implantation apparatus includes a beam scanner that provides reciprocating beam scanning in a beam scanning direction, a beam current measurer that measures a beam current intensity distribution in the beam scanning direction at a downstream of the beam scanner, and a scanning waveform preparing unit that determines whether or not a measured beam current intensity distribution measured by the beam current measurer with use of a given scanning waveform fits a target non-uniform dose amount distribution, and that, in a case of fitting, correlates the given scanning waveform with the target non-uniform dose amount distribution.

According to an aspect of the invention, there is provided a scanning waveform preparation method for an ion implantation apparatus. The ion implantation apparatus includes a beam scanner that provides reciprocating beam scanning in a beam scanning direction and a beam current measurer that measures a beam current intensity distribution in the beam scanning direction at a downstream of the beam scanner. The scanning waveform preparation method includes determining whether or not a measured beam current intensity distribution measured by the beam current measurer with use of a given scanning waveform fits a target non-uniform dose amount distribution, and, in a case of fitting, correlating the given scanning waveform with the target non-uniform dose amount distribution.

In addition, the arbitrary combinations of the aforementioned components, and the substitutions of the components and the expressions of the present invention among apparatuses, methods, systems, computer programs, and recording media having stored therein the computer programs may effectively be used as aspects of the invention.

BRIEF DESCRIPTION OF THE DRAWINGS

FIG. 1A is a top view illustrating the schematic configuration of an ion implantation apparatus according to an embodiment and FIG. 1B is a side view illustrating the schematic configuration of the ion implantation apparatus according to the embodiment;

FIG. 6 illustrates a target two-dimensional dose amount distribution on the wafer;

DETAILED DESCRIPTION OF THE INVENTION

Figure 2:
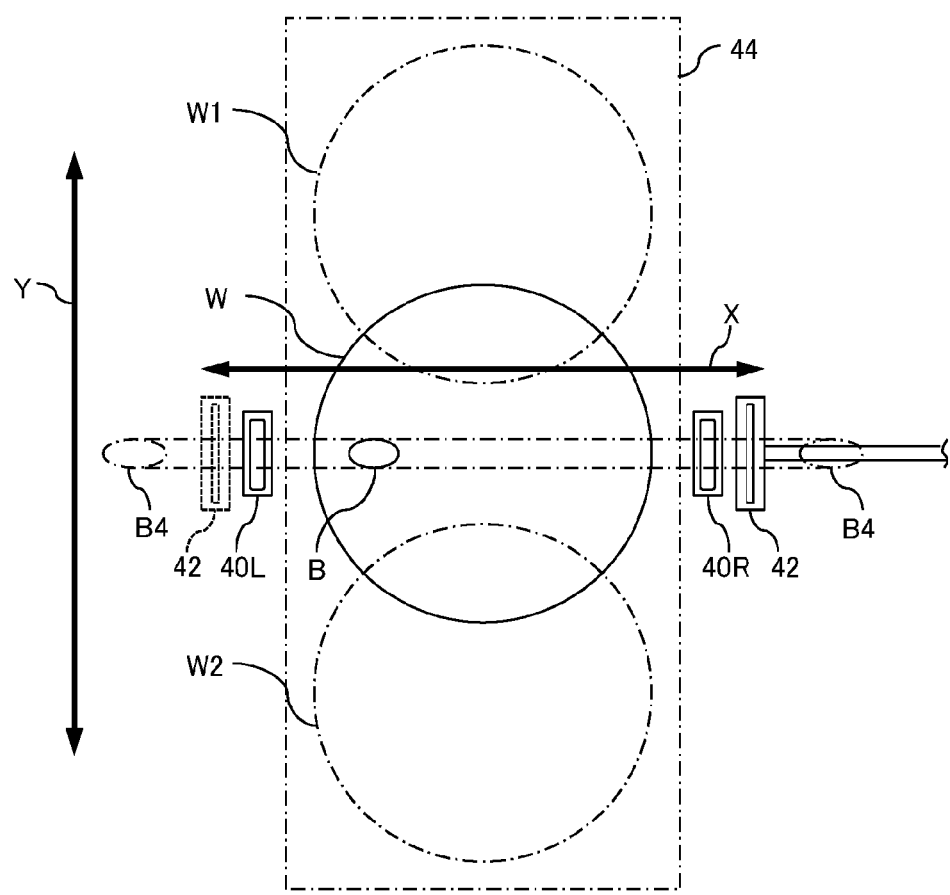
FIG. 2 is a front view illustrating a relation between a reciprocated wafer and a scanned ion beam.

The invention will now be described by reference to the preferred embodiments. This does not intend to limit the scope of the present invention, but to exemplify the invention.

First, a background to the present inventors' arrival at the present invention will be described.

In an ion implantation apparatus, a uniform dose amount distribution in a wafer plane is generally required. In this case, a beam scanning pattern is generally corrected based on actual measurement of beam current. In this correction, the beam current amount per unit time in a position corresponding to the wafer diameter is actually measured by a certain method so that the beam current amount per unit time may be constant, and the beam scanning pattern is changed based on the actual measurement. Thereafter, the actual measurement of the beam current and the change of the beam scanning pattern are repeated until a spatial distribution of the beam current per unit time falls within a certain threshold value. The reason for using such a repeating method is that it is difficult in principle to mathematically make the spatial distribution uniform under a finite beam width condition.

Here, in a case in which an in-plane non-uniform dose amount implantation is to be performed, there is a method for obtaining a beam scanning pattern for the desired non-uniform implantation by performing calculation with use of the beam scanning pattern for uniform implantation to perturb the scanning pattern. However, in this case, a difference is generated between a target in-plane non-uniform dose amount implantation shape and an actual implantation shape depending on the beam width, and accurate dose amount pattern control cannot be performed.

In an embodiment of the present invention, in an in-plane two-dimensional non-uniform dose amount implantation, to obtain a beam scanning pattern that fits a desired dose amount pattern, setting of a tentative scanning pattern, check of beam current in an irradiating position of a wafer position, and pass-fail determination are repeated until the appropriate beam scanning pattern is obtained.

Specifically, as a target pattern of beam current in an irradiating position of a wafer position, a spatial distribution of beam current that can achieve an aimed non-uniform implantation is selected, a spatial distribution of beam current measured in the irradiating position of wafer position and the target pattern are directly compared, and a repeating method is used until a difference therebetween falls below a predetermined threshold value.

In this way, in the in-plane two-dimensional non-uniform dose amount implantation, dependency of an in-plane dose amount non-uniform implantation pattern on a beam width can be suppressed, and a difference between a predicted in-plane dose amount non-uniform implantation shape and an actual shape can be reduced. Consequently, accurate dose amount pattern control can be performed.

The reason why such a repeating method is required will further be described. Generally, as for a beam width in an ion scanning direction in a single wafer hybrid ion implantation apparatus, (i) the beam width is a finite beam width at each point, and (ii) the beam width has positional dependency in the ion scanning direction. Especially, about (ii), trajectory lengths from an ion source differ from each other in principle at a wafer center portion and at a wafer end portion, and the beam widths also differ from each other in principle through rotation of an emittance ellipse in phase space. In reality, positional dependency of a dynamic aperture in the ion scanning direction is also a cause for the positional dependency of the beam width. Under such a situation, the effect of the beam width on the aimed beam current special distribution is mathematically convoluted, and it cannot be deconvoluted. This is a reason for performing correction in the beam scanner based on repeating measurement of beam current.

This situation is true of a case of intentionally performing non-uniform implantation. That is, in a case in which non-uniform implantation is to be performed with an in-plane dose amount prediction performance equivalent to that in normal uniform implantation, correction based on repeating measurement of beam current, as is performed in normal uniform implantation, needs to be performed.

To perform the repeating measurement in the non-uniform implantation, measurement positional accuracy of a beam current measuring instrument is important. That is, in normal uniform implantation, uniformity is generally secured by checking beam current at several points in the irradiating position of the wafer plane. In non-uniform implantation, positional accuracy of beam current measurement is required in accordance with positional accuracy of a non-uniform implantation pattern. Since positional accuracy of a non-uniform implantation pattern is generally required to be 30 mm or less, positional accuracy of beam current measurement is also required to be at least 30 mm or less. Needless to say, it is better for the value of this positional accuracy to be higher.

Also, as differences between the uniform implantation and the non-uniform implantation, while, in the uniform implantation, implantation accuracy on an entire wafer surface is absolutely required, in the non-uniform implantation, (1) implantation accuracy on an entire wafer surface is required in some cases, and (2) implantation accuracy only in a limited area on the wafer surface is required in other cases. Detailed description of the (2) case is provided by taking an example. For example, requirements of implanting a standard dose amount in an area of 100 mm or less from a wafer center and implanting an amount 10% larger than the standard dose amount in an area further outside than a position of 120 mm from the wafer center are conceived of. In this case, an area of 100 mm to 120 mm from the wafer center is considered as a transition area. In this area, a dose amount thereof is not particularly required to have accuracy and can be in a range from the standard dose amount to 110% of the standard dose amount. Accordingly, as for the pass-fail determination, a similar method to that of the normal implantation needs to be used in the (1) case, and the determination can be performed except in the predetermined transition area in the (2) case. Here, the length of the transition area is typically 5 mm to 30 mm. This length of the transition area matches the aforementioned positional accuracy of beam current measurement (30 mm or less).

Hereinafter, embodiments of the present invention will be described in detail with reference to the drawings. The same reference sign will be assigned to the same element in the drawings, and duplicate description thereof will not be presented as is appropriate. The configurations described below are merely examples but are not for purposes of limiting the scope of the present invention.

FIG. 1 is a schematic diagram that illustrates an ion implantation apparatus 10 according to an embodiment. FIG. 1A is a top view that illustrates a schematic configuration of the ion implantation apparatus 10, and FIG. 1B is a side view that illustrates a schematic configuration of the ion implantation apparatus 10.

The ion implantation apparatus 10 is configured to perform the ion implantation processing on the surface of the target. The target is, for example, a substrate. For example, the substrate may be a semiconductor wafer. Thus, for convenience of description, the target may be referred to as the wafer W. However, it is not intended that the target of the implantation processing is limited to a specific object.

The ion implantation apparatus 10 is configured to irradiate the ion beam B to the entire wafer W by at least one of the operations of scanning the beam in a reciprocating manner and reciprocating the wafer W. In the present specification, for convenience of description, the traveling direction of the ion beam B in design is defined as the Z direction, and the plane perpendicular to the Z direction is defined as the XY plane. In the case where the ion beam B is scanned over the target W, the beam scanning direction is defined as the X direction, and the direction perpendicular to the Z direction and the X direction is defined as the Y direction (Hereinafter, also referred to as a mechanical scanning direction).

The ion implantation apparatus 10 includes an ion source 12, a beamline device 14, and an implantation processing chamber 16. The ion source 12 is configured to supply the ion beam B to the beamline device 14. The beamline device 14 is configured to transport ions from the ion source 12 to the implantation processing chamber 16. In addition, the ion implantation apparatus 10 includes a vacuum pumping system (not illustrated in the figure) that is used for providing a desired vacuum environment for the ion source 12, the beamline device 14, and the implantation processing chamber 16.

As illustrated in the drawings, a beamline device 14 includes, for example, a mass analyzing unit 18, a variable aperture 20, a beam focusing/defocusing unit 22, a first beam measurement unit 24, a beam scanner 26, a parallelizing lens 30 or a beam parallelizing device, and an angular energy filter (AEF) 34 in order from the upstream side. The upstream side of the beamline device 14 indicates the side near the ion source 12, and the downstream side indicates the side near the implantation processing chamber 16 (or a beam stopper 38).

The mass analyzing unit 18 is provided at the downstream side of the ion source 12, and is configured to analyze the necessary ion species from the ion beam B extracted from the ion source 12.

The variable aperture 20 is an aperture capable of adjusting the aperture width, and adjusts the beam current amount of the ion beam B passing through the aperture by changing the aperture width. The variable aperture 20 includes, for example, upper and lower aperture plates which are disposed on the beam trajectory interposed therebetween, and may adjust the beam current amount by changing the gap between the aperture plates.

The beam focusing/defocusing unit 22 includes a focusing lens such as a quadrupole focusing device (Q-lens), and is configured to shape the ion beam B which has passed through the variable aperture 20 into a desired cross-sectional shape.

The first beam measurement unit 24 is disposed so as to move into or out of the beam trajectory, and is an injector flag faraday cup for measuring the current of the ion beam. The first beam measurement unit 24 includes a faraday cup 24b which measures a beam current and a driving unit 24a which moves the faraday cup 24b up and down. When the faraday cup 24b is disposed on the beam trajectory as indicated by the dashed line of FIG. 1B, the ion beam B is interrupted by the faraday cup 24b. Meanwhile, when the faraday cup 24b is separated from the beam trajectory as indicated by the solid line of FIG. 1B, the interruption of the ion beam B is canceled.

The beam scanner 26 is configured to provide reciprocating scanning of the ion beam in the beam scanning direction in accordance with a scanning waveform. The beam scanner 26 is a deflection unit which is configured to scan the shaped ion beam B in the X direction. The beam scanner 26 includes scanner electrodes 28 which are separated from each other in the X direction. The scanner electrodes 28 are connected to a variable voltage source (not illustrated), and deflect the ion beam B by changing an electric field generated between the electrodes in accordance with a change in the voltage applied to the scanner electrodes 28. In this way, the ion beam B is scanned in a reciprocating manner in the X direction. The reciprocating beam scanning indicated by the arrow X is exemplified in FIG. 1A, and a plurality of trajectories of the ion beam B are indicated by the dash-dotted chain lines.

The beam scanner 26 is in an electric field type, and a magnetic field type beam scanner may be used. Alternatively, a beam scanner using both the electric field and the magnetic field may be used.

The parallelizing lens 30 is configured to cause the traveling direction of the scanned ion beam B to be parallel to each other. The parallelizing lens 30 includes a circular-arc P-lens electrode 32 having an ion beam passage slit at the center portion thereof. The P-lens electrode 32 is connected to a high-voltage power supply (not illustrated), and sets the traveling direction of the ion beam B in parallel by applying the electric field generated by supplied voltage to the ion beam B.

The angular energy filter 34 analyzes the energy of the ion beam B, deflects the ion which has desired energy downward, and leads the ion to the implantation processing chamber 16. The angular energy filter 34 includes a magnetic field deflection magnet (not illustrated) or electric field deflection AEF electrodes 36, or both. A high-voltage power supply (not illustrated) is connected to the AEF electrodes 36. In FIG. 1B, a positive voltage is applied to the upper AEF electrode 36 and a negative voltage is applied to the lower AEF electrode 36, such that the ion beam B is deflected downward.

In this way, the beamline device 14 includes a beamline component provided at the upstream side or the downstream side of the beam scanner 26 and enabling the beam width on the wafer surface in the beam scanning direction to be adjusted.

The beamline device 14 supplies the ion beam B to be irradiated to the wafer W to the implantation processing chamber 16.

The implantation processing chamber 16 includes a mechanical scanner 44 (see FIG. 2) which holds one or plural wafers W and causes a relative movement (for example, in the Y direction) between the wafer W to the ion beam B if necessary. FIG. 1B illustrates a state where the wafer W moves in a reciprocating manner along the arrow Y. Further, the implantation processing chamber 16 includes the beam stopper 38. When the wafer W does not exist on the beam path, the ion beam B is incident into the beam stopper 38.

The implantation processing chamber 16 is provided with a second beam measurement unit 50 serving as a beam current measurer or measuring instrument. The second beam measurement unit 50 is configured to measure a beam current intensity distribution in the beam scanning direction at the downstream of the beam scanner 26. The second beam measurement unit 50 includes side cups 40R and 40L and a center cup 42.

The side cups 40R and 40L are disposed so as to be deviated from the wafer W in the X direction, and are disposed at a position where the ion beam directed to the wafer W is not interrupted during the ion implantation processing. Since the ion beam B is over-scanned in a range exceeding the range of the wafer W, a part of the scanning beam is incident into the side cups 40R and 40L even in the ion implantation processing. Accordingly, the beam current intensity during the ion implantation processing is measured. The measurement values of the side cups 40R and 40L are transmitted to the second beam measurement unit 50.

The center cup 42 is used to measure the beam current intensity distribution at an irradiating position on the surface of the wafer W. The center cup 42 is movable, and is retracted from the irradiating position during the ion implantation processing, and is inserted into the irradiating position when the wafer W does not exist at the irradiation position. The center cup 42 measures the beam current intensity distribution in the beam scanning direction by measuring the beam current intensity while the center cup 42 being moved in the X direction. The measurement value of the center cup 42 is transmitted to the second beam measurement unit 50. The center cup 42 may be formed in an array shape in which a plurality of faraday cups are arranged in the X direction so as to simultaneously measure the beam current intensity of a plurality of positions in the beam scanning direction.

In this way, the second beam measurement unit 50 can measure the beam current intensity distribution in the beam scanning direction at the same position as that of the wafer surface in the Z direction. Also, the second beam measurement unit 50 may be configured to measure the beam current intensity distribution in the beam scanning direction at an upstream position with respect to the wafer surface. Alternatively, as described below, the second beam measurement unit 50 may be configured to measure the beam current intensity distribution in the beam scanning direction at a downstream position with respect to the wafer surface.

The implantation processing chamber 16 is provided with protective plates 46R and 46L. The protective plates 46R and 46L are disposed so as to be deviated from the wafer W in the X direction, and are disposed at a position where the ion beam directed to the wafer W or the ion beam directed to the side cups 40R and 40L is not interrupted during the ion implantation processing. The protective plates 46R and 46L prevent the ion beam, which is over-scanned in a range exceeding the range of the wafer W, from being irradiated to the inner wall of the implantation processing chamber 16 or the device provided inside the implantation processing chamber 16. The protective plates 46R and 46L are composed of graphite or the like. The protective plates 46R and 46L are provided at the downstream side of the beam scanner 26 and may be provided in the beamline device 14.

The controller 60 controls the operation of each of the units constituting the ion implantation apparatus 10. For example, the controller 60 controls the beam scanner 26 and the mechanical scanner 44 such that a desired target two-dimensional dose amount distribution is provided on the wafer surface.

The controller 60 generates a beam scanner control signal for controlling the beam scanner 26 such that a scanning electric field (or a scanning magnetic field in a case of using a magnetic field) is applied to the beam scanner 26 in accordance with a scanning waveform (for example, a scanning waveform illustrated in FIG. 7A or 7B) and outputs the signal to the beam scanner 26. The beam scanner control signal may be in any form as long as the signal provides a scanning waveform. Similarly, the controller 60 generates a mechanical scanner control signal for controlling the mechanical scanner 44 such that the wafer W is reciprocated appropriately in sync with the reciprocating beam scanning performed by the beam scanner 26 and outputs the signal to the mechanical scanner 44. The mechanical scanner control signal may be in any form as long as the signal provides appropriate mechanical scanning.

FIG. 2 is a front view illustrating a relation between the reciprocated wafer W and the scanned ion beam B. In FIG. 2, the ion beam B is scanned in the horizontal direction (the X direction), and the wafer W is reciprocated in the vertical direction (the Y direction) while being held by the mechanical scanner 44. Such combination of the beam scanning with the mechanical scanning is called hybrid scanning. FIG. 2 illustrates the operation range of the mechanical scanner 44 by illustrating the wafer W1 at the uppermost position and the wafer W2 at the lowermost position.

Further, in the ion beam B scanned by the beam scanner, the scannable range of the ion beam B is indicated by the ion beam B4 at the scanning end position. The ion beam B is configured to be over-scanned in a range passing through the positions of the side cups 40R and 40L disposed at the right and left sides of the mechanical scanner 44 or the position of the center cup 42 movable in the X direction. FIG. 2 illustrates a state where the ion beam B which extends in the horizontal direction is scanned. However, the shape of the ion beam B may extend in the vertical direction or may be substantially circular.

Figure 3:
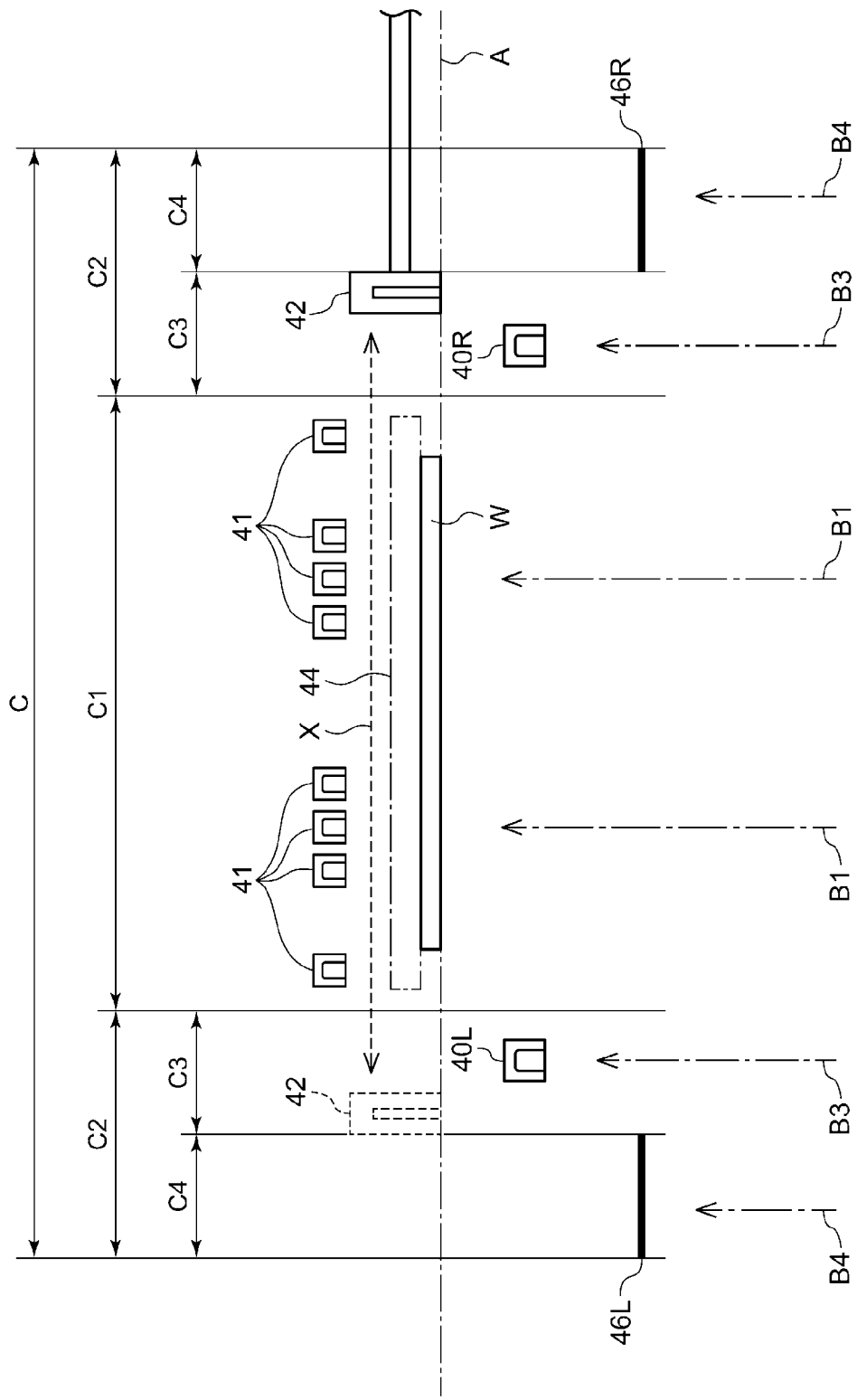
FIG. 3 is a top view illustrating a scanning range of the ion beam.

FIG. 3 is a view illustrating a scannable range C of the ion beam B and corresponds to the top view of FIG. 2. The scannable range C may be roughly classified into two ranges of an implantation area C1 and a non-implantation area C2. The implantation area C1 is the range of the wafer W, and may be called an inner range in relation to the positions of the side cups 40R and 40L. Thus, the ion beam B1 directed to the irradiation area C1 is incident into the wafer W reciprocated by the mechanical scanner 44, and hence the ion beam contributes to the ion implantation processing. In the present specification, the implantation area C1 is called a scanning range in some cases.

Meanwhile, the non-implantation area C2 is an area which is located at the outside of the irradiation area C1 and corresponds to the outside of the range of the wafer W. Thus, the ion beams B3 and B4 which are directed to the non-implantation area C2 are not incident into the wafer W reciprocated by the mechanical scanner 44, and do not contribute to the ion implantation processing.

Further, the non-implantation area C2 includes a side measurement position C3 and a scanning end position C4. The side measurement position C3 corresponds to the installation positions of the side cups 40R and 40L. Since the ion beams B3 which are directed to the side measurement positions C3 are incident into the side cups 40R and 40L, the beam current intensity can be measured even during the ion implantation processing by scanning the ion beam up to the side measurement positions C3. The scanning end positions C4 correspond to the installation positions of the protective plates 46R and 46L. Thus, the ion beams B4 which are directed to the scanning end positions C4 are incident into the protective plates 46R and 46L. For that reason, even in a case in which the ion beam is scanned up to the scanning end position C4, it is possible to prevent the ion beam from being irradiated to an unexpected position inside the implantation processing chamber 16.

As illustrated in FIG. 3, since the center cup 42 is a movable beam current detector, the center cup 42 may measure the beam current intensity distribution at the position A corresponding to the wafer surface in the irradiation area C1 and a partial range (for example, a range excluding the scanning end position C4) of the non-irradiation area C2. The position A corresponds to the same position of the wafer surface in the Z direction with respect to the Z direction as the traveling direction of the ion beam B. When the irradiation area C1 is divided into about one thousand micro zones and the beam current intensity is measured for each micro zone while the center cup 42 is moved in the X direction, the beam current intensity distribution in the beam scanning direction (the X direction) on the wafer surface may be obtained.

Alternatively, the second beam measurement unit 50 may include a plurality of beam current detectors 41 at the downstream of the wafer W. The beam current detectors 41 are in a fixed type in a similar manner to those of the side cups 40R and 40L. The beam current detectors 41 are arranged in the X direction and can measure the beam current intensity distribution at respective X positions. The beam current detectors 41 may be arranged densely in the X position, which is the aforementioned transition area, and may be arranged sparsely in the other areas. Each of the beam current detectors 41 preferably has measurement position accuracy of 30 mm or less in the X direction.

Figure 4:
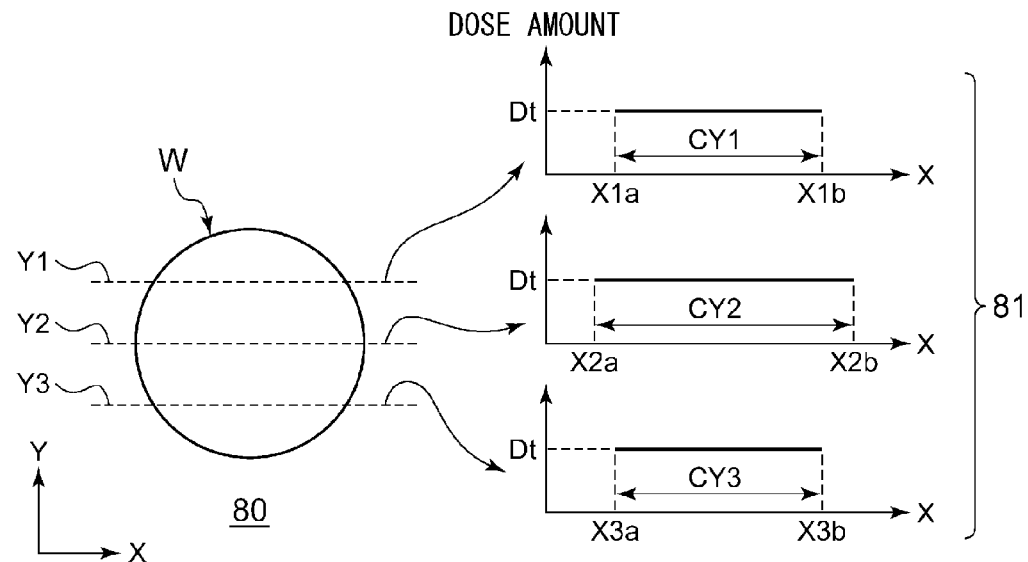
FIG. 4 illustrates a target two-dimensional dose amount distribution on a wafer.
Figure 5:
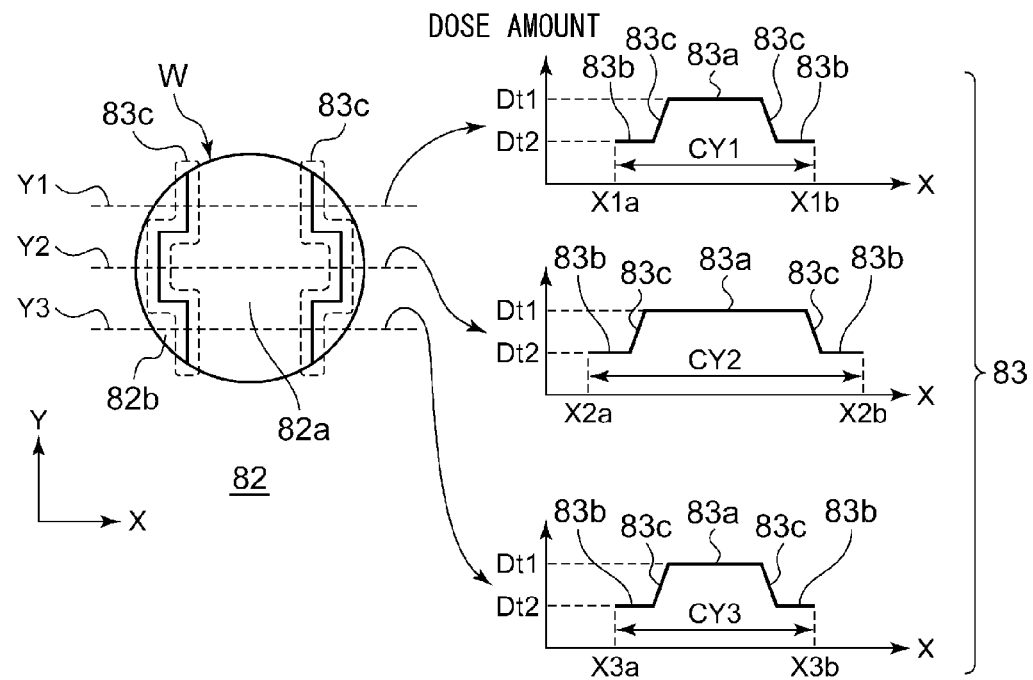
FIG. 5 illustrates a target two-dimensional dose amount distribution on the wafer.

FIGS. 4, 5, and 6 illustrate target two-dimensional dose amount distributions on the wafer W. FIG. 4 illustrates a target two-dimensional uniform dose amount distribution 80. FIG. 5 illustrates a target two-dimensional non-uniform dose amount distribution 82, and FIG. 6 illustrates another target two-dimensional non-uniform dose amount distribution 84. As described above, the X direction represents the beam scanning direction while the Y direction represents the mechanical scanning direction.

Also, each of FIGS. 4, 5, and 6 illustrates target one-dimensional dose amount distributions in the X direction at three Y positions Y1, Y2, and Y3. FIG. 6 additionally illustrates target one-dimensional dose amount distributions in the X direction at Y positions Y4 and Y5. X positions at both ends of the wafer at the Y positions Y1, Y2, Y3, Y4, and Y5 are indicated as (X1a, X1b), (X2a, X2b), (X3a, X3b), (X4a, X4b), and (X5a, X5b), respectively. Scanning ranges CY1, CY2, CY3, CY4, and CY5 at the Y positions Y1, Y2, Y3, Y4, and Y5 are defined by the X positions at both the ends of the wafer.

Needless to say, these target dose amount distributions are illustrative only for understanding and do not intend to limit distributions to the illustrated specific distributions.

As illustrated in FIG. 4, the target two-dimensional uniform dose amount distribution 80 covers the entire area of the wafer surface and has a uniform target dose amount Dt. In this way, the target two-dimensional uniform dose amount distribution 80 includes a plurality of target one-dimensional uniform dose amount distributions 81 formed at different Y positions. Each target one-dimensional uniform dose amount distribution 81 is a dose amount distribution in the X direction. In general, the target dose amount Dt in the case of uniform implantation is required to be achieved accurately. In this sense, the entire area of the target one-dimensional uniform dose amount distribution 81 is an accurate implantation area and has no transition area.

The target two-dimensional non-uniform dose amount distribution 82 illustrated in FIG. 5 has a first target dose amount Dt1 in a center area 82a and has a second target dose amount Dt2, which is different from the first target dose amount Dt1, in an outer area 82b. The first target dose amount Dt1 is larger than the second target dose amount Dt2. The target two-dimensional non-uniform dose amount distribution 82 includes a plurality of target one-dimensional non-uniform dose amount distributions 83 formed at different Y positions. Each target one-dimensional non-uniform dose amount distribution 83 is a dose amount distribution in the X direction.

It is to be noted that the target one-dimensional non-uniform dose amount distribution 83 has a first accurate implantation area 83a, a second accurate implantation area 83b, and a transition area 83c. The dose amount in the first accurate implantation area 83a is set to the first target dose amount Dt1, and the dose amount in the second accurate implantation area 83b is set to the second target dose amount Dt2. The first accurate implantation area 83a and the second accurate implantation area 83b are adjacent to each other in the X direction with the transition area 83c interposed therebetween.

The target two-dimensional non-uniform dose amount distribution 82 includes a group of target one-dimensional non-uniform dose amount distributions 83 each having the transition area 83c and arranged in the Y direction. The center area 82a is constituted by three rectangular parts arranged in the Y direction. Thus, the transition area 83c extends in a polygonal line shape over the group of target one-dimensional non-uniform dose amount distributions 83.

The other target two-dimensional non-uniform dose amount distribution 84 illustrated in FIG. 6 has a third target dose amount Dt3 in a center area 84a and has a fourth target dose amount Dt4, which is different from the third target dose amount Dt3, in an outer circumferential area 84b. The third target dose amount Dt3 is larger than the fourth target dose amount Dt4. The target two-dimensional non-uniform dose amount distribution 84 includes a plurality of target one-dimensional non-uniform dose amount distributions 85 formed at different Y positions.

The target one-dimensional non-uniform dose amount distribution 85 has a third accurate implantation area 85a, a fourth accurate implantation area 85b, and a transition area 85c. The dose amount in the third accurate implantation area 85a is set to the third target dose amount Dt3, and the dose amount in the fourth accurate implantation area 85b is set to the fourth target dose amount Dt4. The third accurate implantation area 85a and the fourth accurate implantation area 85b are adjacent to each other in the X direction with the transition area 85c interposed therebetween.

The target two-dimensional non-uniform dose amount distribution 84 includes a group of target one-dimensional non-uniform dose amount distributions 85 each having the transition area 85c and arranged in the Y direction. The center area 84a is circular. Thus, the transition area 85c extends in a circular arc over the group of target one-dimensional non-uniform dose amount distributions 85.

Since each of the transition areas 83c and 85c serves as a boundary between the two accurate implantation areas, lower implantation accuracy can be allowed in the transition area than that in the accurate implantation area. The length of each of the transition areas 83c and 85c in the X direction is 5 mm or longer and 30 mm or shorter, for example.

Also, the target two-dimensional non-uniform dose amount distribution 84 includes a plurality of target one-dimensional uniform dose amount distributions 86 formed at different Y positions. Each of the target one-dimensional uniform dose amount distributions 86 has the fourth target dose amount Dt4. In this way, the target two-dimensional non-uniform dose amount distribution 84 may include both the non-uniform one-dimensional dose amount distribution and the uniform one-dimensional dose amount distribution. Depending on the shape of the target two-dimensional non-uniform dose amount distribution, the target two-dimensional non-uniform dose amount distribution may include at least one target one-dimensional non-uniform dose amount distribution and at least one target one-dimensional uniform dose amount distribution.

Meanwhile, in the present specification, a target one-dimensional (uniform or non-uniform) dose amount distribution is called a target dose amount distribution for simplicity in some cases. Similarly, a one-dimensional beam current intensity distribution described below is simply called a beam current intensity distribution in some cases.

Figure 7A:
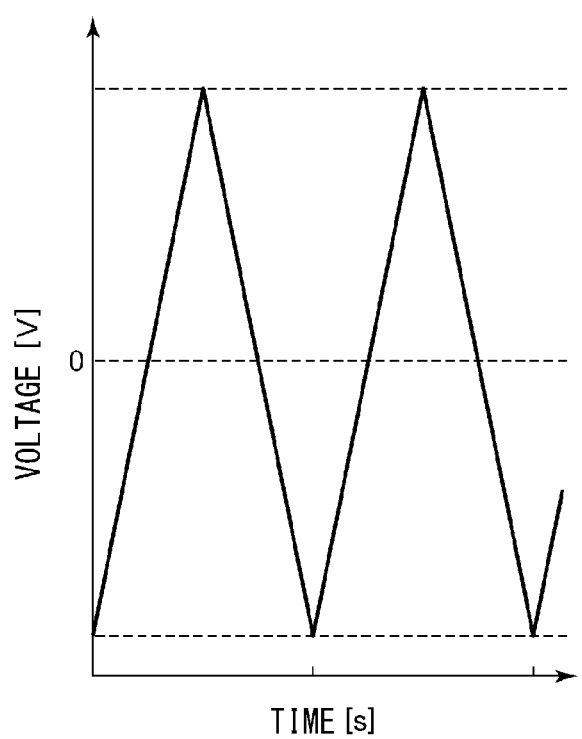
FIGS. 7A and 7B illustrate scanning waveforms for controlling a beam scanner.
Figure 7B:
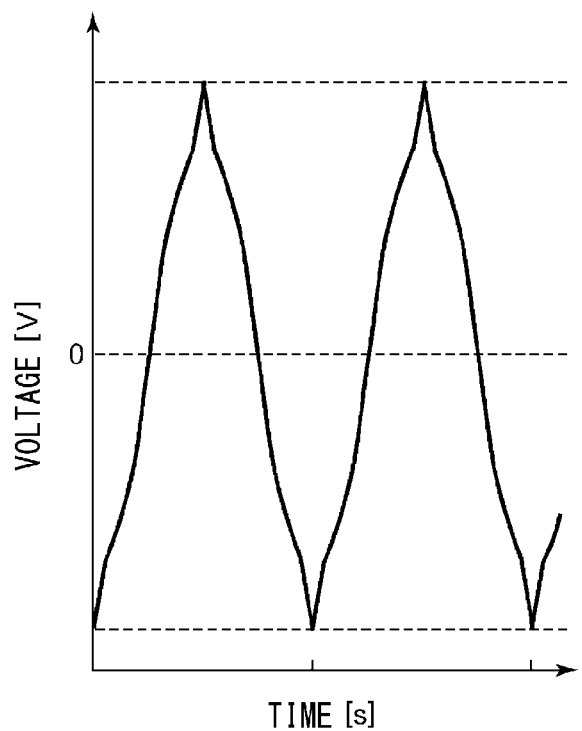

FIGS. 7A and 7B illustrate scanning waveforms for controlling the beam scanner 26. The scanning waveform defines a scanning speed distribution and a scanning cycle of reciprocating beam scanning. Since the beam scanner 26 is of an electric field type, the scanning waveform corresponds to a scanning voltage waveform to be applied to the beam scanner 26, that is, a waveform indicating a temporal change of a potential difference between the scanner electrodes 28.

The scanning waveform illustrated in FIG. 7A is a triangular wave in which voltage linearly changes as time goes by. Such a scanning waveform can often be used as an initial value. Since the scanning voltage linearly changes as time goes by, the scanning speed is constant over the scanning range.

Apparently, the target two-dimensional uniform dose amount distribution 80 can be obtained when the linear triangular-wave scanning waveform is used. However, it is not so easy to do so from various causes. In most cases, the scanning waveform is modified to obtain the target two-dimensional uniform dose amount distribution 80.

By temporally integrating the beam current intensity distribution on the wafer W, the dose amount distribution on the wafer W is obtained. In this way, the beam current intensity distribution is related to the dose amount distribution. Also, when the scanning speed is high at a certain place, the beam current intensity at the place is low. Conversely, when the scanning speed is low at a certain place, the beam current intensity at the place is high.

Thus, by modifying the scanning waveform, a measured beam current intensity distribution can be closer to a target beam current intensity distribution related to a target dose amount distribution. In an area in which the measured beam current intensity is higher than the target beam current intensity, the scanning waveform is modified to increase the scanning speed. Conversely, in an area in which the measured beam current intensity is lower than the target beam current intensity, the scanning waveform is modified to decrease the scanning speed. By repeating modification of the scanning waveform and measurement of the beam current intensity distribution, the measured beam current intensity distribution can be sufficiently close (ideally, equal) to the target beam current intensity distribution. In this way, the measured beam current intensity distribution can fit the target dose amount distribution.

FIG. 7B illustrates a modified scanning waveform. It is apparent from the scanning waveform in FIG. 7B that, unlike the initial scanning waveform in FIG. 7A, one part and another part in each cycle have different slopes of scanning voltage (that is, scanning speeds) from each other.

Figure 8:
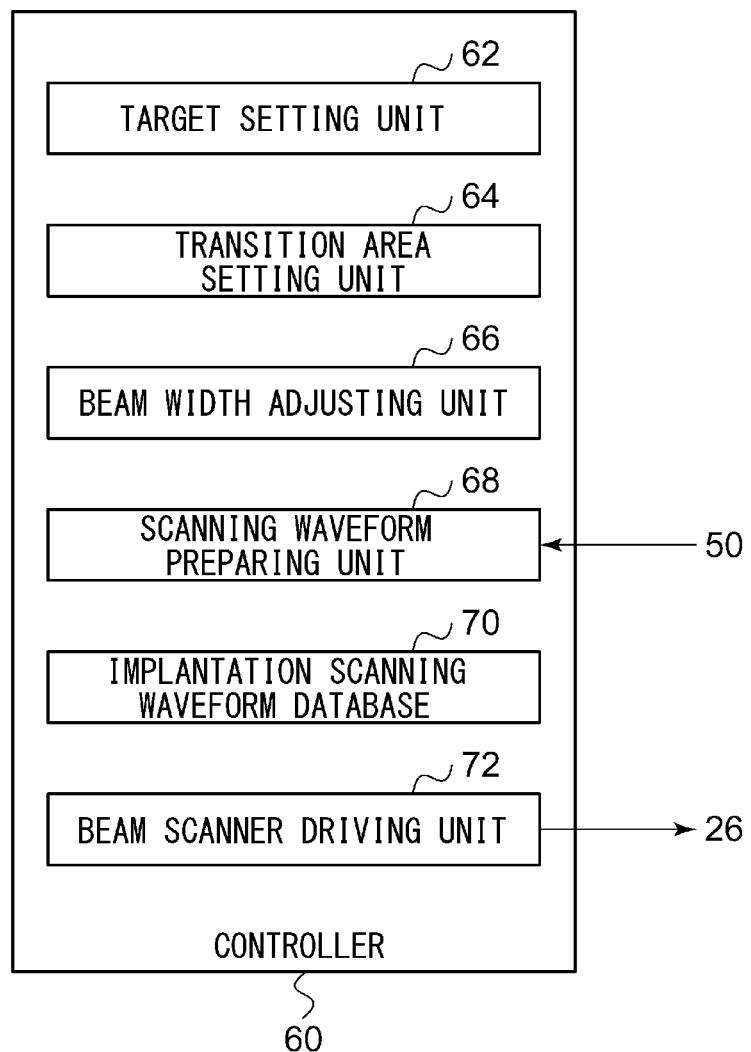
FIG. 8 schematically illustrates a controller according to an embodiment.

FIG. 8 schematically illustrates the controller 60 according to the present embodiment. FIG. 8 is a block diagram of the functional configuration of the controller 60.

The blocks illustrated in the block diagram of the present specification are achieved by components, circuits, or mechanical devices such as a CPU and a memory of a computer as a hardware configuration and are achieved by a computer program or the like as a software configuration. The functional blocks herein are achieved by the cooperation thereof. Thus, it is understood by the person skilled in the art that the functional blocks are achieved in various ways by the combination of hardware and software.

The controller 60 includes a target setting unit 62, a transition area setting unit 64, a beam width adjusting unit 66, a scanning waveform preparing unit 68, an implantation scanning waveform database 70, and a beam scanner driving unit 72.

The target setting unit 62 is configured to convert a target two-dimensional non-uniform dose amount distribution into a plurality of target dose amount distributions each of which is a dose amount distribution in the beam scanning direction and which are formed in different positions from each other in the mechanical scanning direction. The transition area setting unit 64 is configured to set the transition area in each target dose amount distribution. The beam width adjusting unit 66 is configured to control at least one beamline component such that the beam width is shorter than the length of the transition area in the beam scanning direction.

The scanning waveform preparing unit 68 is configured to prepare an implantation scanning waveform that fits a target dose amount distribution based on a measurement result of the second beam measurement unit 50. The scanning waveform preparing unit 68 repeats preparing or modifying a scanning waveform in a predetermined procedure and determining whether or not a measured beam current intensity distribution measured by the second beam measurement unit 50 with use of the scanning waveform fits a target non-uniform dose amount distribution until a fitting measured beam current intensity distribution is found.

The implantation scanning waveform database 70 is configured to store the implantation scanning waveforms prepared by the scanning waveform preparing unit 68.

The beam scanner driving unit 72 is configured to obtain the scanning waveforms corresponding to the plurality of target dose amount distributions from the scanning waveform database 70. The beam scanner driving unit 72 is configured to select one of the obtained scanning waveforms in accordance with the substrate position in the mechanical scanning direction and drive the beam scanner 26 with use of the selected scanning waveform. In this way, the hybrid scanning illustrated in FIG. 2 is achieved.

Figure 9:
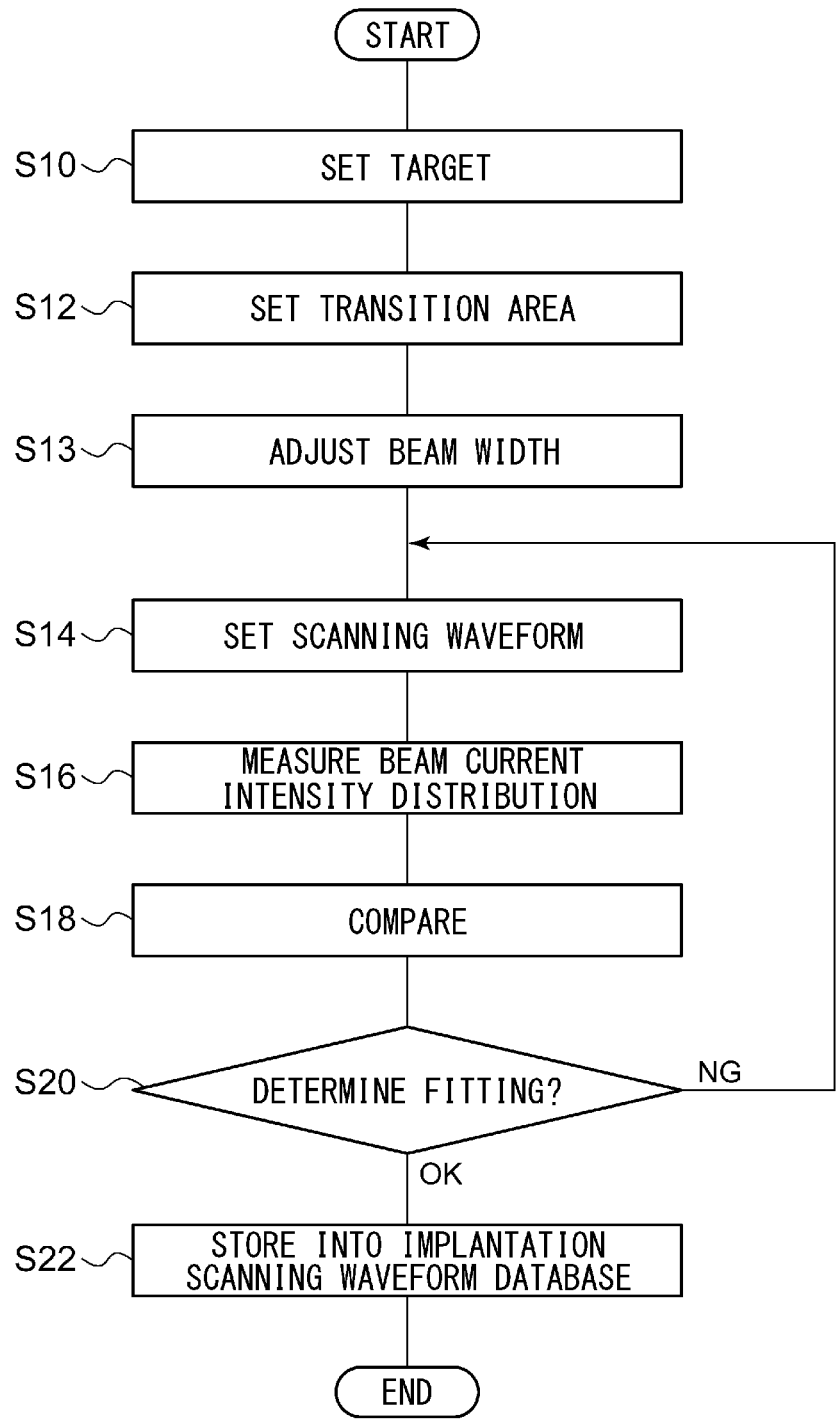
FIG. 9 is a flowchart illustrating a scanning waveform preparation method according to an embodiment.
Figure 10:
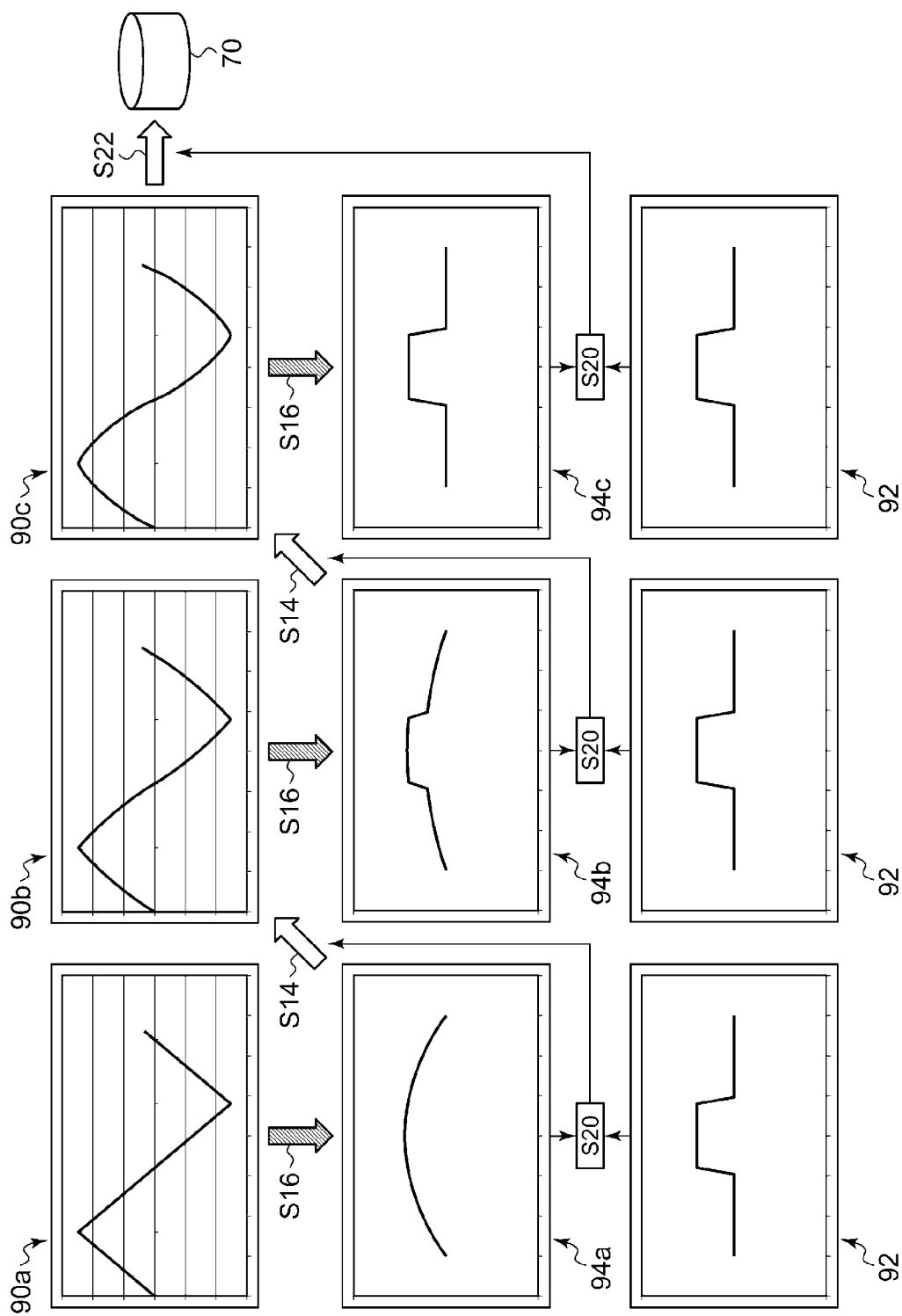
FIG. 10 illustrates a state in which a scanning waveform is modified by a repeating method in FIG. 9.

FIG. 9 is a flowchart illustrating a scanning waveform preparation method according to an embodiment. This method is executed at a preliminary step of the ion implantation processing. FIG. 10 illustrates a state in which a scanning waveform is modified by a repeating method in FIG. 9.

First, a target two-dimensional non-uniform dose amount distribution is input into the controller 60, and the target setting unit 62 converts the target two-dimensional non-uniform dose amount distribution into a plurality of target dose amount distributions (S10). An example of the target two-dimensional non-uniform dose amount distribution is the target two-dimensional non-uniform dose amount distribution 82 illustrated in FIG. 5, and the target setting unit 62 converts the target two-dimensional non-uniform dose amount distribution 82 into the plurality of target one-dimensional non-uniform dose amount distributions 83. As described above, the target two-dimensional non-uniform dose amount distribution may include a target one-dimensional non-uniform dose amount distribution.

The transition area setting unit 64 sets a transition area in each of the plurality of target dose amount distributions (S12). For example, for the target one-dimensional non-uniform dose amount distribution 83, the transition area setting unit 64 sets the transition area 83c between the first accurate implantation area 83a and the second accurate implantation area 83b. Since a target one-dimensional uniform dose amount distribution has no transition area, the transition area setting unit 64 sets no transition area in the target one-dimensional uniform dose amount distribution.

As needed, the beam width adjusting unit 66 may control at least one beamline component such that the beam width is shorter than the length of the transition area in the beam scanning direction (S13).

The scanning waveform preparing unit 68 sets a scanning waveform (S14). At initial time, the scanning waveform preparing unit 68 provides the beam scanner driving unit 72 with an initial value 90a of the scanning waveform. The initial value 90a of the scanning waveform may be the linear triangular scanning waveform illustrated in FIG. 7A or the scanning waveform modified for uniform implantation illustrated in FIG. 7B, for example. Such scanning waveforms may be stored in the implantation scanning waveform database 70 in advance, and the scanning waveform preparing unit 68 may read out one of them from the implantation scanning waveform database 70.

The beam scanner driving unit 72 drives the beam scanner 26 with use of the scanning waveform set by the scanning waveform preparing unit 68. The beam scanner 26 provides reciprocating beam scanning in the beam scanning direction in accordance with the set scanning waveform. The second beam measurement unit 50 measures a beam current intensity distribution in the beam scanning direction at the downstream of the beam scanner 26 (S16).

The scanning waveform preparing unit 68 compares a target beam current intensity distribution related to a target non-uniform dose amount distribution with a measured beam current intensity distribution 94a (S18). The scanning waveform preparing unit 68 determines whether or not the measured beam current intensity distribution 94a fits a target non-uniform dose amount distribution 92 based on the comparison result (S20).

In a case in which any transition area is set, the scanning waveform preparing unit 68 compares the target beam current intensity distribution with the measured beam current intensity distribution except in the transition area. That is, the comparison between the target beam current intensity distribution and the measured beam current intensity distribution is not performed in the transition area. The scanning waveform preparing unit 68 compares the target beam current intensity distribution with the measured beam current intensity distribution only in the accurate implantation area. In this way, the scanning waveform preparing unit 68 eliminates the transition area and determines whether or not the measured beam current intensity distribution fits the target non-uniform dose amount distribution.

In a case in which no transition area is set, the scanning waveform preparing unit 68 compares the target beam current intensity distribution with the measured beam current intensity distribution over the scanning range of the beam scanner for ion implantation into the substrate surface. In this way, the scanning waveform preparing unit 68 determines whether or not the measured beam current intensity distribution fits the target non-uniform dose amount distribution over the entire area of the scanning range.

In a case in which the measured beam current intensity distribution 94a does not fit the target non-uniform dose amount distribution 92 (NG in S20), the scanning waveform preparing unit 68 sets a scanning waveform 90b instead of the scanning waveform 90a (S14). With use of the set scanning waveform 90b, a beam current intensity distribution 94b is measured again by the second beam measurement unit 50 (S16). In this way, the scanning waveform preparing unit 68 modifies the scanning waveform 90a into the scanning waveform 90b and determines again whether or not the measured beam current intensity distribution 94b newly measured with use of the scanning waveform 90b fits the target non-uniform dose amount distribution 92 (S20). Setting of the scanning waveform, measurement of the beam current intensity distribution, and fitting determination are repeated until a fitting measured beam current intensity distribution 94c is found.

In a case in which the measured beam current intensity distribution 94c fits the target non-uniform dose amount distribution 92 (OK in S20), the scanning waveform preparing unit 68 adopts a scanning waveform 90c set in this case as a scanning waveform for implantation of the target non-uniform dose amount distribution 92. That is, the scanning waveform preparing unit 68 correlates the scanning waveform 90c with the target non-uniform dose amount distribution 92. As needed, the scanning waveform preparing unit 68 stores the scanning waveform 90c correlated with the target non-uniform dose amount distribution 92 into the implantation scanning waveform database 70 (S22).

In this way, a scanning waveform for a certain target non-uniform dose amount distribution is determined. Similarly, a scanning waveform for another target non-uniform dose amount distribution is determined. That is, for each of the plurality of target non-uniform dose amount distributions, the scanning waveform preparing unit 68 determines whether or not a measured beam current intensity distribution measured by the second beam measurement unit 50 with use of a certain scanning waveform fits the target non-uniform dose amount distribution, and in a case of fitting, correlates the certain scanning waveform with the target non-uniform dose amount distribution and stores the certain scanning waveform into the implantation scanning waveform database 70.

According to the present embodiment, since the repeating method is used, in which a beam current intensity distribution is measured and a scanning waveform is modified based on the measurement, dependency on the beam width can be eliminated from the beam current intensity distribution. Thus, a difference between a target two-dimensional non-uniform dose amount distribution and an actually implanted dose amount distribution can be suppressed, and an accurate two-dimensional non-uniform implantation can be provided on the wafer surface.

Figure 11:
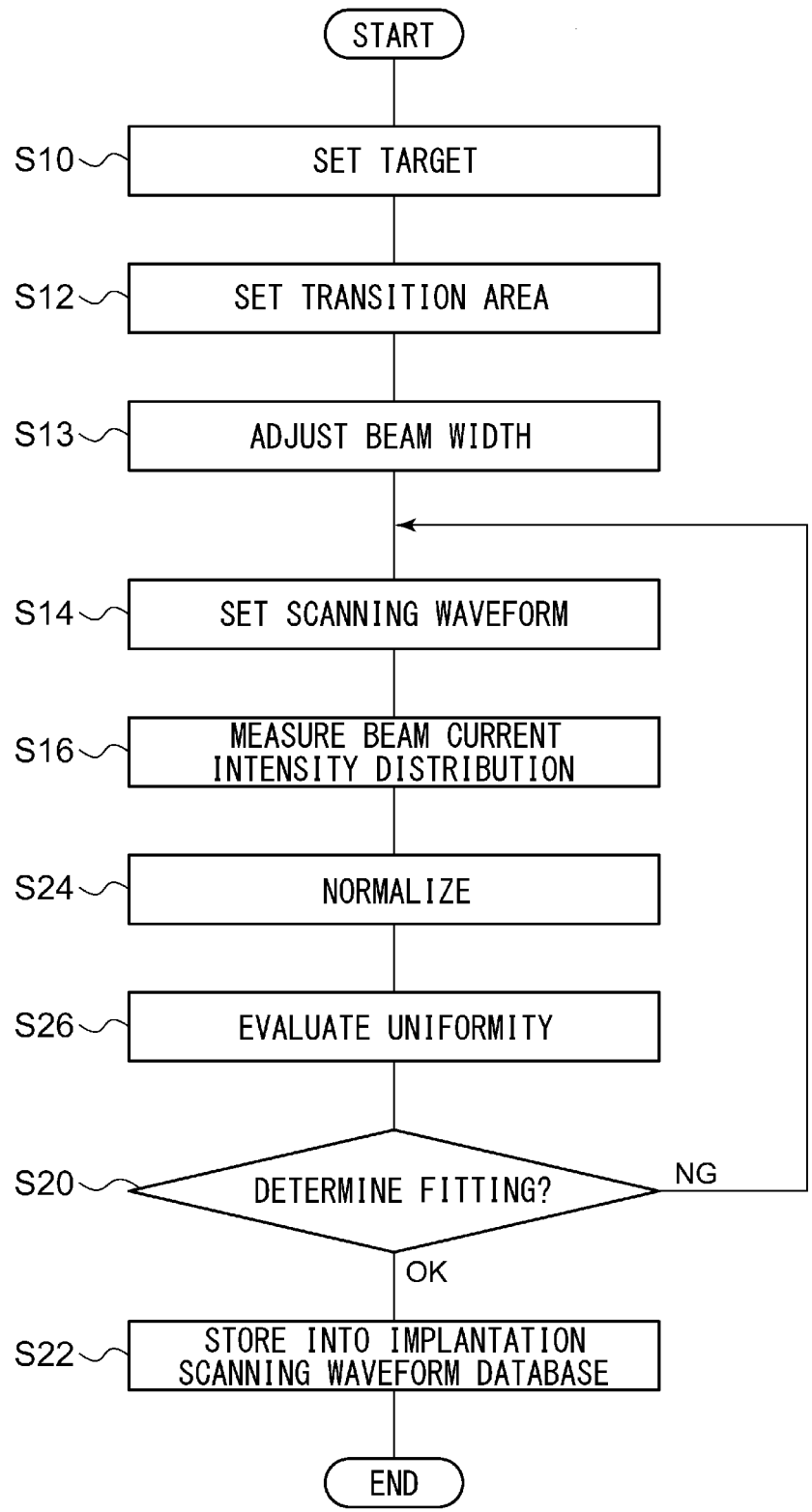
FIG. 11 is a flowchart illustrating a scanning waveform preparation method according to another embodiment.

FIG. 11 is a flowchart illustrating a scanning waveform preparation method according to another embodiment. The method in FIG. 11 includes normalization (S24) and uniformity evaluation (S26) instead of comparison (S18) in FIG. 9. The other steps in the method in FIG. 11 are similar to those in the method in FIG. 9.

The scanning waveform preparing unit 68 normalizes the measured beam current intensity distribution with use of the target beam current intensity distribution related to the target non-uniform dose amount distribution and evaluates uniformity of the normalized measured beam current intensity distribution to determine whether or not the measured beam current intensity distribution fits the target non-uniform dose amount distribution.

As the normalization, the scanning waveform preparing unit 68 may calculate a beam current intensity distribution difference, which is a difference between the measured beam current intensity distribution and the target beam current intensity distribution. The scanning waveform preparing unit 68 may evaluate uniformity of the beam current intensity distribution difference. In a case in which the beam current intensity distribution difference falls within a predetermined threshold value, the scanning waveform preparing unit 68 determines that the beam current intensity distribution difference is uniform and determines that the measured beam current intensity distribution fits the target non-uniform dose amount distribution. In a case in which the beam current intensity distribution difference does not fall within the predetermined threshold value, the scanning waveform preparing unit 68 determines that the beam current intensity distribution difference is not uniform and determines that the measured beam current intensity distribution does not fit the target non-uniform dose amount distribution.

As the normalization, the scanning waveform preparing unit 68 may calculate a beam current intensity distribution ratio, which is a ratio between the measured beam current intensity distribution and the target beam current intensity distribution. The scanning waveform preparing unit 68 may evaluate uniformity of the beam current intensity distribution ratio. In a case in which the beam current intensity distribution ratio falls within a predetermined threshold value, the scanning waveform preparing unit 68 determines that the beam current intensity distribution ratio is uniform and determines that the measured beam current intensity distribution fits the target non-uniform dose amount distribution. In a case in which the beam current intensity distribution ratio does not fall within the predetermined threshold value, the scanning waveform preparing unit 68 determines that the beam current intensity distribution ratio is not uniform and determines that the measured beam current intensity distribution does not fit the target non-uniform dose amount distribution.

Also, the scanning waveform preparing unit 68 may normalize the measured beam current intensity distribution with use of the target beam current intensity distribution over the scanning range of the beam scanner for ion implantation into the substrate surface and may evaluate uniformity of the normalized measured beam current intensity distribution. The scanning waveform preparing unit 68 may eliminate a predetermined transition area, normalize the measured beam current intensity distribution with use of the target beam current intensity distribution, and evaluate uniformity of the normalized measured beam current intensity distribution.

Although the present invention has been described above with reference to the aforementioned embodiments, the embodiments of the present invention are not limited to those described above, and appropriate combinations or replacements of the features of the embodiments are also encompassed by the present invention. The embodiments may be modified by way of combinations, rearranging of the processing sequence, design changes, etc., based on the knowledge of a skilled person, and such modifications are also within the scope of the present invention.

It should be understood that the invention is not limited to the above-described embodiment, but may be modified into various forms on the basis of the spirit of the invention. Additionally, the modifications are included in the scope of the invention.

What is claimed is:

1. An ion implantation apparatus comprising:
   a beam scanner that provides reciprocating beam scanning in a beam scanning direction in accordance with a scanning waveform;
   a mechanical scanner that reciprocates a substrate in a mechanical scanning direction;
   a controller that controls the beam scanner and the mechanical scanner such that a target two-dimensional non-uniform dose amount distribution is provided on a surface of the substrate; and
   a beam current measurer that measures a beam current intensity distribution in the beam scanning direction at a downstream of the beam scanner,
   wherein the controller includes:
   a target setting unit that converts the target two-dimensional non-uniform dose amount distribution into a plurality of target dose amount distributions each of which is a dose amount distribution in the beam scanning direction and which are formed in different positions from each other in the mechanical scanning direction; and
   a beam scanner driving unit that obtains scanning waveforms corresponding to the plurality of target dose amount distributions from an implantation scanning waveform database, selects one of the obtained scanning waveforms in accordance with a position of the substrate in the mechanical scanning direction, and drives the beam scanner with use of the selected scanning waveform,
   wherein the plurality of target dose amount distributions include at least one target non-uniform dose amount distribution, and
   wherein the controller further includes a scanning waveform preparing unit that determines whether or not a measured beam current intensity distribution measured by the beam current measurer with use of a given scanning waveform fits the target non-uniform dose amount distribution, and that, in a case of fitting, correlates the given scanning waveform with the target non-uniform dose amount distribution and stores the scanning waveform into the implantation scanning waveform database.

2. The ion implantation apparatus according to claim 1, wherein, in a case in which the measured beam current intensity distribution does not fit the target non-uniform dose amount distribution, the scanning waveform preparing unit modifies the given scanning waveform and determines whether or not a measured beam current intensity distribution newly measured with use of the modified scanning waveform fits the target non-uniform dose amount distribution.

3. The ion implantation apparatus according to claim 1, wherein the scanning waveform preparing unit repeats preparing a scanning waveform in a predetermined procedure and determining whether or not a measured beam current intensity distribution measured by the beam current measurer with use of the prepared scanning waveform fits the target non-uniform dose amount distribution until the measured beam current intensity distribution is found to fit.

4. The ion implantation apparatus according to claim 1, wherein the scanning waveform preparing unit determines whether or not the measured beam current intensity distribution fits the target non-uniform dose amount distribution over a scanning range by the beam scanner for ion implantation into the surface of the substrate.

5. The ion implantation apparatus according to claim 1, wherein the target non-uniform dose amount distribution has a first accurate implantation area whose dose amount is set to a first target dose amount and a second accurate implantation area whose dose amount is set to a second target dose amount and which is adjacent to the first accurate implantation area in the beam scanning direction, wherein the controller includes a transition area setting unit that sets a transition area between the first accurate implantation area and the second accurate implantation area, and wherein the scanning waveform preparing unit eliminates the transition area and determines whether or not the measured beam current intensity distribution fits the target non-uniform dose amount distribution.

6. The ion implantation apparatus according to claim 5, further comprising:

a beamline component that is provided upstream or downstream of the beam scanner and that can adjust a beam width on the surface of the substrate in the beam scanning direction, wherein the controller includes a beam width adjusting unit that controls the beamline component such that the beam width is shorter than a length of the transition area in the beam scanning direction.

7. The ion implantation apparatus according to claim 5, wherein a length of the transition area in the beam scanning direction is 5 mm or longer and 30 mm or shorter.

8. The ion implantation apparatus according to claim 5, wherein the plurality of target dose amount distributions include a group of target non-uniform dose amount distributions each having the transition area and arranged in the mechanical scanning direction, and the transition area extends over the group of target non-uniform dose amount distributions.

9. The ion implantation apparatus according to claim 1, wherein the scanning waveform preparing unit compares a target beam current intensity distribution related to the target non-uniform dose amount distribution with the measured beam current intensity distribution to determine whether or not the measured beam current intensity distribution fits the target non-uniform dose amount distribution.

10. The ion implantation apparatus according to claim 1, wherein the scanning waveform preparing unit normalizes the measured beam current intensity distribution with use of a target beam current intensity distribution related to the target non-uniform dose amount distribution and evaluates uniformity of the normalized measured beam current intensity distribution to determine whether or not the measured beam current intensity distribution fits the target non-uniform dose amount distribution.

11. The ion implantation apparatus according to claim 10, wherein the scanning waveform preparing unit evaluates uniformity of a beam current intensity distribution difference, which is a difference between the measured beam current intensity distribution and the target beam current intensity distribution.

12. The ion implantation apparatus according to claim 10, wherein the scanning waveform preparing unit evaluates uniformity of a beam current intensity distribution ratio, which is a ratio between the measured beam current intensity distribution and the target beam current intensity distribution.

13. The ion implantation apparatus according to claim 10, wherein the scanning waveform preparing unit normalizes the measured beam current intensity distribution with use of the target beam current intensity distribution over a scanning range of the beam scanner for ion implantation into the surface of the substrate and evaluates uniformity of the normalized measured beam current intensity distribution.

14. The ion implantation apparatus according to claim 10, wherein the scanning waveform preparing unit eliminates a predetermined transition area, normalizes the measured beam current intensity distribution with use of the target beam current intensity distribution, and evaluates uniformity of the normalized measured beam current intensity distribution.

15. The ion implantation apparatus according to claim 1, wherein the beam current measurer has measurement position accuracy of 30 mm or less in the beam scanning direction.

16. The ion implantation apparatus according to claim 1, wherein the beam current measurer measures a beam current intensity distribution in the beam scanning direction at a same position as that of the surface of the substrate.

17. The ion implantation apparatus according to claim 1, wherein the beam current measurer measures a beam current intensity distribution in the beam scanning direction at an upstream or downstream position with respect to an irradiating position of the surface of the substrate.

18. The ion implantation apparatus according to claim 1, wherein the plurality of target dose amount distributions include at least two target non-uniform dose amount distributions, and wherein, for each of the at least two target non-uniform dose amount distributions, the scanning waveform preparing unit determines whether or not a measured beam current intensity distribution measured by the beam current measurer with use of a given scanning waveform fits the target non-uniform dose amount distribution, and in a case of fitting, the scanning waveform preparing unit correlates the given scanning waveform with the target non-uniform dose amount distribution and stores the scanning waveform into the implantation scanning waveform database.

19. An ion implantation apparatus comprising:

a beam scanner that provides reciprocating beam scanning in a beam scanning direction;

a beam current measurer that measures a beam current intensity distribution in the beam scanning direction at a downstream of the beam scanner; and a scanning waveform preparing unit that determines whether or not a measured beam current intensity distribution measured by the beam current measurer with use of a given scanning waveform fits a target non-uniform dose amount distribution, and that, in a case of fitting, correlates the given scanning waveform with the target non-uniform dose amount distribution.

20. A scanning waveform preparation method for an ion implantation apparatus, the ion implantation apparatus comprising a beam scanner that provides reciprocating beam scanning in a beam scanning direction and a beam current measurer that measures a beam current intensity distribution in the beam scanning direction at a downstream of the beam scanner, the scanning waveform preparation method comprising:

determining whether or not a measured beam current intensity distribution measured by the beam current measurer with use of a given scanning waveform fits a target non-uniform dose amount distribution; and, in a case of fitting, correlating the given scanning waveform with the target non-uniform dose amount distribution.

* * * * *